United States Patent [15] 3,685,045
Pastoriza [45] Aug. 15, 1972

[54] DIGITAL-TO-ANALOG CONVERTERS

[72] Inventor: James J. Pastoriza, Lincoln, Mass.

[73] Assignee: Analog Devices, Inc., Cambridge, Mass.

[22] Filed: March 24, 1969

[21] Appl. No.: 809,700

[52] U.S. Cl. ...........................340/347 DA, 307/253
[51] Int. Cl. ...H03k 13/04, H03k 13/25, H03k 17/00
[58] Field of Search.........340/347 DA; 307/253, 255

[56] References Cited

UNITED STATES PATENTS

| | | | |
|---|---|---|---|
| 3,508,249 | 4/1970 | Gordon | 340/347 DA |
| 3,530,460 | 9/1970 | Sheffield | 340/347 DA |
| 3,541,354 | 11/1970 | Basham | 340/347 DA |
| 2,886,753 | 5/1959 | Abbott | 340/347 X |
| 3,078,451 | 2/1963 | Sable | 340/347 |
| 3,382,438 | 5/1968 | Geller | 340/347 X |

OTHER PUBLICATIONS

D. Hoeschele, Analog- to- Digital/Digital- to- Analog Conversion Techniques, 1968; pp. 121- 123, 133- 136, 168- 178, & 208- 213.

*Primary Examiner*—Maynard R. Wilbur
*Assistant Examiner*—Thomas J. Sloyan
*Attorney*—Bryan, Parmelee, Johnson & Bollinger

[57] ABSTRACT

A digital-to-analog converter utilizing a set of high-speed current switches each comprising a buffer transistor and a switching transistor interconnected with a common resistor in such a fashion that the buffer transistor in the normal "off" state supplies the common resistor with a current of predetermined magnitude to bias the switching transistor to cut-off; a control pulse coupled through an input diode cuts off the buffer transistor, the bias at the switching transistor is thereby eliminated, and the switching transistor immediately conducts. The magnitude of current supplied to a summing point by each switching transistor is fixed in accordance with a weighted relationship determined by the order of the binary bit represented by the respective transistor; for one group of switching transistors, the current levels are determined by current-dividing networks individual to each transistor; in a second group, the current levels are determined by a ladder network interconnecting the transistors to the summing point; in a third group, each transistor is arranged to conduct the correct amount of current by appropriate loading of its output circuit. Special means are provided for assuring smooth transitions between positive and negative outputs, and to compensate for the effects of ambient temperature variations.

32 Claims, 2 Drawing Figures

INVENTOR
*James J. Pastoriza*

BY

*Robertson Bryan Parmelee & Johnson*
ATTORNEYS

DIGITAL-TO-ANALOG CONVERTERS

This invention relates to digital-to-analog converters. More particularly, this invention relates to such converters which are capable of high-speed conversion with stability and freedom from transient effects.

A wide variety of digital-to-analog converters have been provided for many purposes heretofore. Initially such converters used vacuum tubes, but as with most electronic devices, vacuum tubes have been replaced with later developed solid-state elements. Since the design criteria of solid-state elements are significantly different from vacuum tubes, this replacement process has presented a number of special problems. In addition, with the increasing speeds attainable by computers and other digital devices, there has been a corresponding demand for increased speed from digital-to-analog converters.

Accordingly, it is a principal object of the present invention to provide solid-state digital-to-analog converters with improved operating characteristics, particularly high-speed conversion capabilities together with reliable, accurate performance. Other objects, aspects and advantages of the invention will in part be pointed out in, and in part apparent from, the following description considered together with the accompanying drawing

DETAILED DESCRIPTION OF THE PREFERRED EMBODIMENT

Figure 1A:
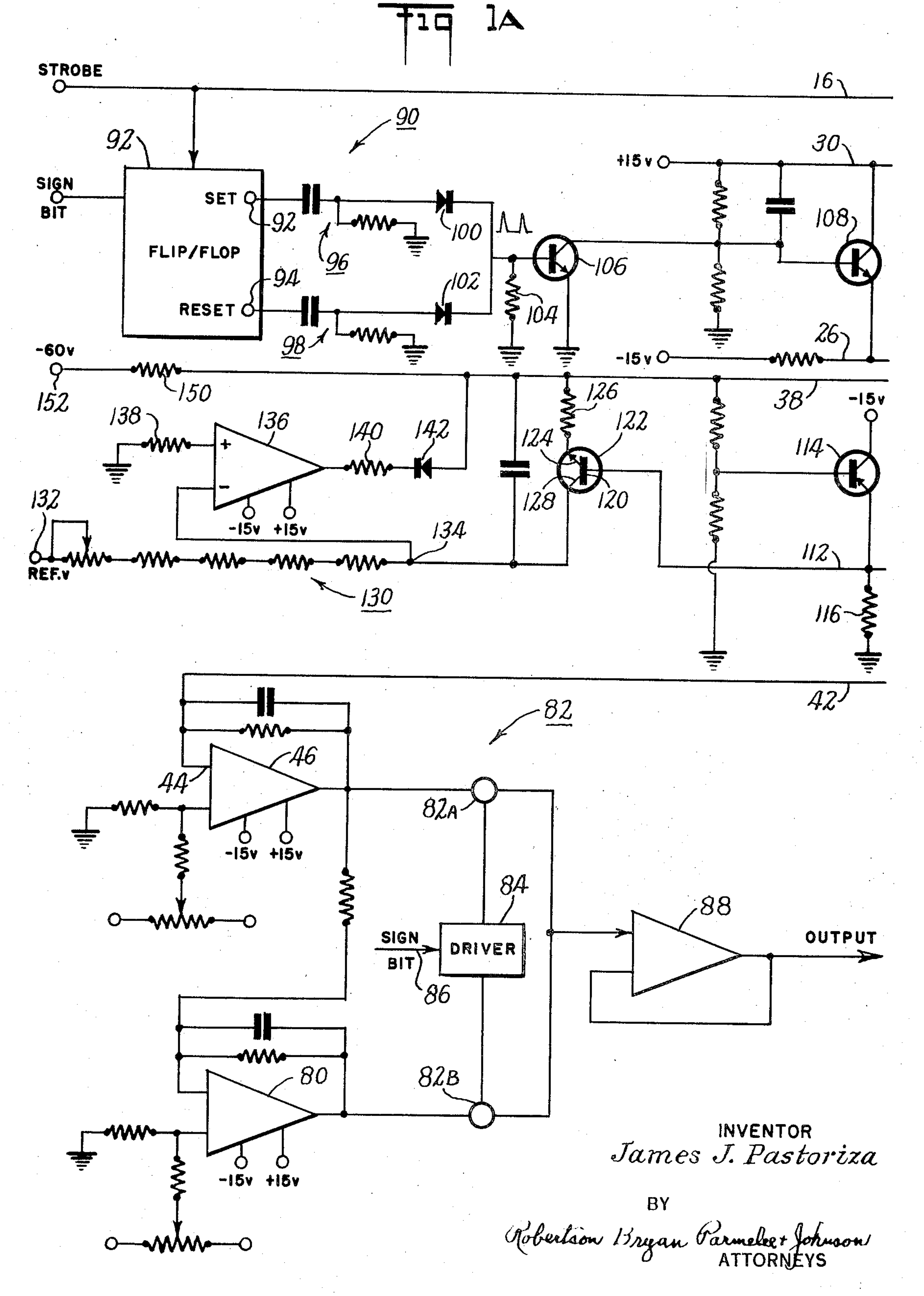
FIGS. 1A and 1B together show a circuit diagram of one presently preferred embodiment of the invention.
Figure 1B:
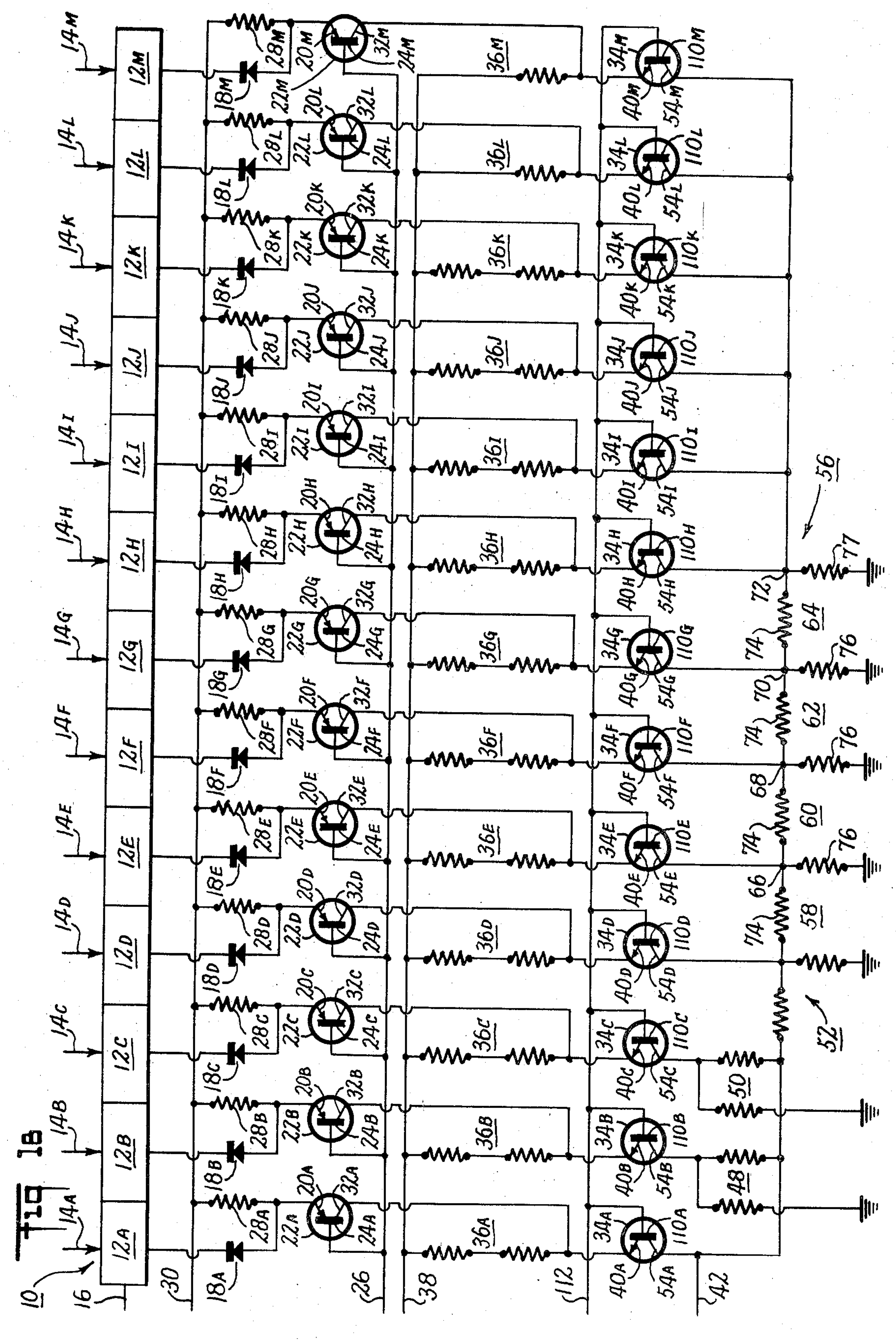

Referring now to the upper portions of FIG. 1B, there is shown a conventional storage register 10 having a series of separate binary stages 12 (12A, etc.). Input leads 14 (14A, etc.) supply to the stages 12 the individual binary elements of a digital number to be converted to a corresponding analog signal level. These input leads may be connected to any digital source (not shown), such as a high-speed data processor.

The binary signals stored in the stages 12 are gated out essentially simultaneously by a strobe circuit 16 energized by conventional gate-generating means (not shown) producing periodic pulses of suitably high frequency. When the stages 12 are thus gated open, the stored binary signals are directed through respective coupling circuits comprising individual diodes 18 (18A, etc.). That is, each stage containing a stored binary bit produces a control pulse which passes through the corresponding coupling diode. This control pulse is of negative polarity, and is applied to the emitter 20 (20A, etc.) of a corresponding PNP buffer transistor 22 (22A, etc.) arranged so as normally to conduct current.

The bases 24 (24A, etc.) of all of the buffer transistors 22 are connected together to a power supply lead 26 providing a regulated bias voltage somewhat more positive than −15 volts. The emitters 20 of all of the buffer transistors are connected through respective resistors 28 (28A, etc.) to a second power supply lead 30 having a regulated voltage of about +15 volts. The collectors 32 (32A, etc.) of the buffer transistors are connected to corresponding PNP switching transistors 34 (34A, etc.) so as to control the output thereof in a manner to be described hereinbelow in detail.

The collector 32 of each buffer transistor 22 is connected to one end of a corresponding load resistor 36 (36A, etc.) forming part of the output circuit of the associated switching transistor 34. The remote ends of these load resistors are connected in common to a power supply lead 38 maintained at about −60 volts. When any buffer transistor is on, its output current flows through the associated load resistor 36, and the resulting voltage drop across this resistor causes the emitter 40 (40A, etc.) of the corresponding switching transistor to be biased to cut-off. Thus, no current will flow through a switching transistor while the associated buffer transistor is on.

When any buffer transistor 22 is cut off by a negative control pulse coupled through its input diode 18, the cut-off bias at the emitter 40 of the corresponding switching transistor 34 disappears, and that transistor therefore immediately conducts. The load circuit of each switching transistor is so arranged that when the transistor is turned on, the magnitude of its output current will be virtually equal to that of the current previously passing through the series resistor 36 from the associated buffer transistor 22. Thus, the operating conditions of the switching transistor will be changed but very little during the switching transition, e.g. the voltage of the emitter 40 may change by only a little more than 0.7 volts, the normal voltage drop across a conducting transistor. This small change in operating voltages tends to assure smooth and rapid switching.

The buffer transistors 22 serve the important function of substantially isolating the switching transistors 34 from the transient effects of the gating strobe control pulse. That is, such a control pulse, if applied directly to the switching transistor, would introduce relatively large momentary signal variations in the output circuit of the transistor, as a result, for example of leakage capacitance coupling of the leading edge of the control pulse. Such transient effects introduce errors in the conversion operation, particularly as the conversion speed is increased to the point where there is insufficient time for the transient effects to settle out. The transient effects of a switching pulse are somewhat erratic, and are difficult to eliminate by conventional circuit arrangements.

The individual buffer transistors 22 significantly minimize the transient effects of capacitive coupling feedthrough to the switch output. The result is a considerable improvement in accuracy of the conversion, especially at high speeds. In addition, the use of the buffer transistors makes it readily possible to strobe the converter with negative-going gate pulses, preferred in such logic circuitry.

The output currents of all of the first eight switching transistors 34A–34H are pre-adjusted to be of exactly the same magnitude (approximately 1 mil), by selection of the appropriate value for the associated load resistors 36A–36H. A portion of the output current of each conducting transistor is coupled through a lead 42 to the summing input terminal 44 (FIG. 1A) of an operational amplifier 46. The magnitude of this portion of current is fixed in accordance with a 2:1 weighting relationship to correspond to the order of the binary bit represented by the respective switching transistor. Specifically, the current contribution of the second transistor 34B is arranged to be one-half that of the first transistor 34A, the current contribution of the third transistor 34C is one-half that of the second 34B, and so forth.

The output of the first switching transistor 34 is connected directly to the summing terminal 44 of the operational amplifier 46, and thus this transistor contributes its entire output. The next three switching transistors 34B, 34C, and 34D are connected to the summing terminal by individual weighting networks comprising current dividers 48, 50, and 52. The preferred form of divider consists of two series-connected resistors the common junction of which is connected to the collector electrode 54 of the associated switching transistor, and the remote terminals of which are connected respectively to ground and the summing input terminal 44 of the operational amplifier 46. Thus, the amount of current contributed by any one of these latter three switching transistors 34B, 34C and 34D is determined by the ratio of the two resistors in the corresponding current-divider network 48, 50 or 52, in such a manner as to provide the required 2:1 ratio from one to the next.

The next four output transistors 34E–34H form a second discrete set, all coupled to the summing input terminal 44 of the operational amplifier 46 by means of a two-to-one ladder network 56 consisting of a series of four cascaded identical stages 58, 60, 62 and 64. The intersection points 66, 68, 70 between the separate stages are connected respectively to the transistor collector electrodes 54E, 54F and 54G, and the right-hand end terminal 72 (serving as the input terminal for the ladder network) is connected to collector electrode 54H. In this ladder network, the ohmic resistance of each series resistance 74 is one-half that of the associates shunt resistance 76. Thus, visualizing the signal flow as proceeding from right to left, each stage of the ladder network provides a 2:1 attenuation of any current supplied thereto, either from the associated switching transistor 34, or from the preceding (right-hand) stage of the ladder network.

Although this ladder network 50 does introduce some distributed capacitance effects, and permits some interaction between the functioning of the associated switching transistors 34, these effects produce relatively small consequences in the overall conversion accuracy because the bits of data involved are several orders down from the most significant bit of the complete digital number. Moreover, such adverse effects are compensated for, at least to some extent, by arranging the switching transistors to produce the same magnitude of current output. This equal-current arrangement tends to minimize instability and other error effects.

The load resistors 36I–36M of the last set of five switching transistors 34I–34M are so proportioned relative to one another as to provide the desired two-to-one ratio in current flow through the respective transistors. The load resistors 28I–28M of the corresponding buffer transistors 22I–22M are similarly proportioned. That is, each resistor in the sequence has a total ohmic resistance of approximately twice that of the preceding resistor of the sequence. Thus, the magnitude of the current supplied by each switching transistor 34I–34M is one-half that of the preceding transistor, i.e. the transistor to the left, as seen in the drawing.

The collector electrodes (54I–54M) of all five of this third set of switching transistors 34I–34M are connected together to the input terminal 72 of the ladder network 56. Any one of the transistors which is gated on will thus supply a corresponding weighted current contribution through the ladder network to the summing input terminal 44 of the amplifier 46. Although the use of currents of different magnitude in each of the switching transistors 34I–34M introduces some asymmetries in the conversion operation, these asymmetries do not have any important effect on the final result because the five transistors of this third set provide digital bits corresponding to the lowest orders of the digital number, i.e. the five least significant bits of the group. The direct connection of this third set provides desirable economies of construction without important performance limitations.

For some application, it is necessary to provide a sign-change capability, i.e. so as to develop either positive or negative analog outputs corresponding to positive or negative digital inputs. Referring to the lower portion of FIG. 1A, such a capability can be provided by coupling the output of the amplifier 46 to an inverting amplifier 80, and by employing a selector switch 82 having two sections 82A, 82B to select either the direct output or the inverted output. The switch 82 is operated by a conventional switch driver 84 controlled by an input lead 86 to which is directed a sign bit, i.e. a binary bit indicating whether the number to be converted is positive or negative. The sign bit is gated by a strobe circuit (not shown) synchronized with the converter strobe. When so gated, the driver 84 opens either switch section 82A or switch section 82B, but not at the same time. The selected analog signal is coupled to an output amplifier 88 which provides the final analog output signal of the converter.

Since it is not readily possible to assure exact synchronism between the operation of the switch 82 and the strobing of the storage register 10, transient errors may be developed in the converter output during the transition between negative and positive outputs. The problem cannot be solved simply by arranging the circuit so that the sign switch 82 is always actuated slightly before or slightly after strobing of the storage register, because a momentary error effect such as an overshoot can result under either circumstance, depending upon the beginning and ending voltages of the analog output. In accordance with a further aspect of the present invention, this problem has been solved by a special arrangement for insuring that the analog output signal, whenever a sign change is to be made, will first be brought to zero potential. Since every sign change requires the analog voltage to pass through zero, automatically shifting the voltage to zero whenever a sign change is to take place insures that the output will not vary in the wrong direction at the outset of a change. Holding the output on zero until all of the switching has been completed prevents overshooting of the final voltage.

In more detail, the converter includes (referring now to the upper left-hand corner of FIG. 1A) a sign change detector 90 which in the present embodiment includes a conventional flip-flop 92 arranged to receive the sign bit as the controlling input, the set and reset outputs of this flip-flop are coupled through respective derivative circuits 96, 98 and isolating diodes 100, 102 on a common load resistor 104. Thus, whenever there is a change of sign (where the sign bit changes from "zero" to "one" or vice-versa), a sharp positive spike will be developed at the load resistor 104. This spike momentarily turns on a transistor switch 106 which, in turn, momentarily disables a transistor 108 serving to establish the bias voltage for the power supply lead 26.

Power supply lead 26 thereupon goes negative and holds the buffer transistors 22 "on," producing a flow of current through all of the resistors 36 for a brief period. This current flow causes all of the switching transistors 34 to be turned off momentarily, thereby making the output voltage of amplifiers 46 and 80 to be held momentarily at zero. Thus, even though the sign-change switch 82 is not exactly synchronized with the gating of the register 10, the converter output will momentarily be shifted to zero during a sign change.

After the spike has subsided at the input to transistor 106, the buffer transistors 22 all are returned to normal operating conditions, and the strobed control pulses fed to these transistors from register 10 will activate the switching transistors 34 in a pattern representing the stored digital number. Thus, the output of the amplifier 88 will be shifted to the proper level, and transient errors during the sign change transition avoided.

Another source of error is changes in ambient temperature, which alter the operating characteristics of the switching transistors 34, and tend to vary the magnitude of current produced thereby. In accordance with a still further aspect of the invention, means are provided to minimize such effects of ambient temperature. More specifically, all of the bases 110 (110A, etc.) of the switching transistors 34 are connected to a bias lead 112 the voltage of which is regulated so as to maintain the current through the switching transistors substantially constant with changes in temperature.

The voltage of the bias lead 112 is primarily determined by a transistor 114 in series with a resistor 116. Bias lead 112 also is connected to the base 120 of a control transistor 122 matched to the first switching transistor 34A, particularly in having a "beta" which tracks the corresponding parameter of transistor 34A with changes in temperature. The emitter 124 of control transistor 122 is connected through a load resistor 126 to the power supply lead 38, and the collector 128 of this transistor is connected through a resistive network 130 to a positive reference voltage terminal 132. The circuit elements are so selected so as to produce a predetermined flow of current through the resistive network 130 and the control transistor 122, and resulting in a zero potential at a control point 134 between the resistive network 130 and the control transistor. The magnitude of the current through transistor 122 is set to equal the flow of current through the switching transistor 34A when the latter has been turned on.

If there is a change in ambient temperature, the result typically will be a change in operating characteristics of the switching transistor 34A, so as to alter the normal current flow therethrough. By positioning the control transistor 122 physically adjacent the switching transistor 34A, the same temperature effect will be experienced by the control transistor. The change of current produced by a change in temperature is detected by an operational amplifier 136 having one input terminal connected to control point 134, and its other input terminal connected through a resistor 138 to ground. The output of this amplifier 136 is connected through a resistor 140 and an isolating diode 142 to power supply lead 38.

When there is a change in the current supplied to the amplifier 136 from control point 134, there will be a corresponding change in the amount of current drawn by this amplifier from the power supply lead 38. Since this power supply lead is connected through a resistor 150 to the power supply terminal 152, the change in current drawn by amplifier 134 will cause a corresponding change in the voltage of power supply lead 38. Thus, the amplifier 134 provides an amplified negative feedback action which automatically alters the voltage of lead 38 in such a way as to maintain constant the current flow through the control transistor 122. Since transistor 122 is matched to switching transistor 34A, the change in potential of power supply lead 38 will have a similar effect on the functioning of this switching transistor, i.e. it will compensate for the change in ambient temperature of transistor 34A, and assure that the current through that transistor is maintained effectively invariant with changes in temperature. Moreover, this result can be achieved with a power supply 152 of relatively modest complexity and cost, because the power supply need not be closely regulated internally.

The same controlling influence tends to maintain constant the current through the other switching transistors 34B, etc. However, as a practical matter these latter transistors need not be so identically matched in characteristics to the first transistor 34A, because they represent binary information of progressively less significance to the ultimate analog output voltage.

Typical values and types of elements used in a preferred embodiment of the invention as described above are as follows:

| | |
|---|---|
| Diodes | 1N4149 |
| Buffer transistors 22 | 2N4250 |
| Switching transistors 34 | SE4010 |
| Operational amplifiers | MC1539G |
| Resistors 28A–28H | 12.7K |
| Resistor 28I | 25.5K |
| Resistor 28J | 51.1K |
| Resistor 28K | 100K |
| Resistor 28L | 200K |
| Resistor 28M | 390K |
| Resistors 36A–36H | 50K |
| Resistor 36I | 100K |
| Resistor 36J | 200K |
| Resistor 36K | 400K |
| Resistor 36L | 800K |
| Resistor 36M | 1.6M |
| Current divider 48 | 2.5K and 2.5K |
| Current divider 50 | 5K and 1.666K |
| Current divider 52 | 3.5K and 1K |
| Series resistor 74 | 500 |
| Shunt resistor 76 | 1K |
| Resistor 77 | 500 |

It will be apparent from the foregoing description that various changes can be made to the preferred embodiment without departing from the spirit of the invention. For example, the values of elements herein disclosed should not be construed as limiting. Other changes suited for particular applications will be apparent to those skilled in this art.

I claim:

1. A digital-to-analog converter comprising: an operational amplifier having a summing input terminal to which current may be directed; a set of current sources each including a switching transistor connected to said summing input terminal of said operational amplifier to supply a current contribution thereto; an output circuit for each transistor including an impedance through which the output current flows when the corresponding transistor is turned on; circuit means connected to each of said switching transistors to adjust the current contribution thereof such that the contribution of each is related to that of the next in the sequence by a predetermined relationship; a set of buffer transistors for turning on the switching transistors, respectively, in a pattern corresponding to the digital number to be converted; means for directing the switching current from each of said buffer transistors to said impedance of the corresponding switching transistor output circuit; means for setting said switching current at a level such that the voltage drop of said impedance biases the associated switching transistor to cut-off so as to prevent any flow of current from that switching transistor to said summing input terminal; input means for supplying to the converter an input signal comprising the individual bits of the digital number to be converted to an analog signal; and means coupling control signals corresponding to each of said bits to a respective buffer transistor to turn off said buffer transistors in said pattern corresponding to said digital number, thereby to turn on corresponding switching transistors the current contributions of which are summed by said operational amplifier to produce the analog output signal.

2. A converter as claimed in claim 1, wherein said impedance comprises a resistor in series with the output circuit of the corresponding switching transistor, the current from the buffer transistor being adjusted to substantially equal the normal output current of the switching transistor when the buffer transistor is turned off.

3. A converter as claimed in claim 2, wherein at least a group of said switching transistors are arranged to produce output currents of equal magnitude, so as to equalize the individual operational characteristics of the switching transistor stages.

4. A converter as claimed in claim 3, wherein said group of switching transistors are arranged to provide currents corresponding to the most significant bits of the incoming digital number.

5. A converter as claimed in claim 1, wherein said input means comprises a storage register; gate means for activating the outputs of the individual stages of said storage register substantially simultaneously; and means for supplying negative control signals from said individual stages to the associated buffer transistor.

6. A digital-to-analog converter as claimed in claim 1, in which said set of current sources comprises a first and second group of transistors all adjusted to conduct currents of equal magnitude; a first set of current dividers each coupled to a corresponding transistor of said first group to provide current contributions of the desired ratio; and a periodic ladder attenuating network coupled to said second group to provide current contributions therefrom of desired ratio.

7. A converter as claimed in claim 6, wherein said current sources comprise a third group of transistors each having means to produce current conductions therethrough of the desired ratio; and means connecting the outputs of said third group to an input terminal of said ladder network.

8. A digital-to-analog converter comprising: an operational amplifier having a summing input terminal to which current may be directed to produce a proportionately corresponding output signal; a set of current sources each including a switching transistor having an output circuit connected to said summing input terminal of said operational amplifier to supply current thereto; means to turn on said switching transistors in a pattern corresponding to a digital number; a power supply circuit for furnishing d-c voltage to said switching transistors; a regulating transistor matched to at least one of said switching transistors and connected to said power supply circuit; a sensing circuit including a second amplifier coupled to said regulating transistor to detect any changes in the current flowing therethrough; feedback means responsive to changes in the output of said second amplifier and operable to alter the output of said power supply circuit so as to tend to maintain the current through said regulating transistor constant, thereby maintaining the current through said switching transistors constant.

9. A converter as claimed in claim 8, wherein all of said switching transistors are set to provide identical current flows; and means connected to the outputs of said switching transistors to supply currents of pre-set ratios to said summing terminal.

10. A converter as claimed in claim 8, wherein said sensing circuit includes a resistive network connected to a reference voltage and arranged to produce a flow of comparison current of predetermined magnitude into the circuit of said regulating transistor; and means connecting a circuit point in the path of said comparison current to an input terminal of said second amplifier to automatically adjust the amplifier output with changes in the current flow drawn by said regulating transistor.

11. A converter as claimed in claim 10, wherein said second amplifier is connected to said power supply circuit to provide the operating current for that amplifier; and resistor means connected between said power supply circuit and an energizing terminal thereof, so that changes in current draw of said second amplifier produce corresponding changes in the voltage drop across said resistor means, thereby altering the potential of the power supply circuit.

12. A digital-to-analog converter for producing either positive or negative analog outputs depending upon the sign of the input digital number signal; said converter comprising a set of current switches individually activatable to produce corresponding currents; output circuit means responsive to the outputs of said switches to produce a single combined summation output current of a predetermined unidirectional polarity and with the individual contributions of each current switch binarily weighted; second circuit means responsive to said single combined output current and operable to produce both a positive and a negative analog signal each corresponding to said combined output current; a sign switch responsive to a sign signal for selecting either said positive or said negative analog signal; sensing means responsive to each sign signal for detecting a change-of-sign condition; and control means operable by said sensing means for shifting said combined output current of said current switches to zero for a very short initial period of time immediately after the start of a transition from a digital number signal of one sign to a digital number signal of another sign, said combined output current thereafter being returned to said predetermined unidirectional polarity.

13. A converter as claimed in claim 12, wherein said second circuit means comprises a pair of operational amplifiers for producing the respective positive and negative outputs.

14. A converter as claimed in claim 13, wherein said amplifiers are connected in cascade, with the second amplifier arranged to invert the output of the first.

15. A converter as claimed in claim 12, including strobe means for gating the digital number to be converted and simultaneously gating a sign bit to said sensing means.

16. A converter as claimed in claim 15, wherein said sensing means includes a pulse-producing circuit responsive to the sign bit; derivative means coupled to the output of the pulse-producing means to develop a short-duration spike each time there is a sign change; said control means being responsive to said spike and operable to disable the current switches for the duration of each spike.

17. In a digital-to-analog converter, the combination of:

- a first set of current sources comprising a plurality of switching transistors each operable to supply a respective current;
- a set of load impedances each connected in the output circuit of a respective switching transistor to carry the output current passing through the associated switching transistor;
- a second set of current sources to provide control currents for said first set of current sources;
- means for setting the level of each control current at a value substantially equal to but slightly larger than the output current of the corresponding switching transistor to be controlled;
- input circuit means responsive to a digital input signal for selectively activating said second set of current sources in a pattern corresponding to the individual bits of the digital input signal;
- means connecting the output of each of said second set of current sources to a corresponding one of said load impedances so as to direct through such impedance the control current produced by the respective one of said second set of current sources;
- means responsive to the flow of said control current through any of said load impedances to turn off the corresponding switching transistor; and
- means to combine currents contributed by activated switching transistors to produce an analog output signal corresponding to the digital input signal.

18. Apparatus as in claim 17, wherein said load impedances differ in accordance with a binary weighting pattern so as to set the currents flowing through the associated switching transistors in accordance with such binary weighting pattern.

19. Apparatus as in claim 17, including means to set the currents through said switching transistors at levels providing equal current densities within the transistors.

20. In a digital-to-analog converter, the combination of:

- a first set of switching transistors each operable to supply a respective current;
- a set of resistors each connected in series with the output of a respective switching transistor to carry the output current passing therethrough;
- a set of buffer transistors arranged as current sources to provide control currents for said set of switching transistors respectively;
- input circuit means responsive to a digital input signal for selectively activating said set of buffer transistors in a pattern corresponding to the individual bits of the digital signal;
- means connecting the output of each of said buffer transistors to a corresponding one of said resistors so as to direct through each such resistor the control current produced by the output circuit of the respective buffer transistor;
- means responsive to the flow of such control current through any of said resistors to turn off the corresponding switching transistor; and
- means to combine currents contributed by all of the activated switching transistors to produce an analog output signal corresponding to the digital input signal.

21. Apparatus as claimed in claim 20, wherein the resistances of said resistors are in a binary weighting pattern so as to set the corresponding switching transistor currents in accordance with such weighting pattern.

22. Apparatus as claimed in claim 20, including means to set the currents through said switching transistors at levels providing equal current densities within the transistors.

23. Apparatus as claimed in claim 20, wherein said input circuit means includes a storage register including individual sections for the bits of a digital input signal; and

- a set of diode means coupling said storage sections respectively to corresponding buffer transistors such that the binary signals directed through said diode means serve to selectively activate said buffer transistors.

24. Apparatus as claimed in claim 20, wherein said switching transistors are NPN transistors serving as constant current sources.

25. Apparatus as claimed in claim 24, wherein said buffer transistors are PNP transistors.

26. Apparatus as claimed in claim 24, including means to maintain the bases of the NPN switching transistors at a predetermined bias voltage.

27. Apparatus as claimed in claim 26, including circuit means operative with each of said buffer transistors and responsive to the activation and deactivation thereof to alter slightly the potential of the emitter electrode of the associated switching transistor to deactivate and activate the switching transistor.

28. In a digital-to-analog converter, the combination of:

- a plurality of switching transistors activatable in a selected pattern corresponding to a digital input signal;
- output circuit means coupled to said switching transistors to combine the currents contributed by any activated switching transistors;

means for setting the currents contributed individually by the switching transistors in accordance with a digital-to-analog weighting pattern;

a power supply for producing a supply voltage for said switching transistors;

a reference transistor energized by said power supply;

sensing means responsive to the current flow through said reference transistor, said sensing means including means operable to adjust the voltage produced by said power supply to tend to maintain the current through said reference transistor constant and thereby to tend to maintain the currents through said switching transistors constant;

said output circuit means being coupled to the collectors of said switching transistors so that the total output current is responsive to the combined collector currents of the activated switching transistors;

said reference transistor being matched to one of said switching transistors;

said sensing means being responsive to the collector current of said reference transistor.

29. In a digital-to-analog converter, the combination of:

a plurality of switching transistors activatable in a selected pattern corresponding to a digital input signal;

output circuit means coupled to said switching transistors to combine the currents contributed by any activated switching transistors;

means for setting the currents contributed individually by the switching transistors in accordance with a digital-to-analog weighting pattern;

a power supply for producing a supply voltage for said switching transistors;

a reference transistor energized by said power supply;

sensing means responsive to the current flow through said reference transistor, said sensing means including means operable to adjust the voltage produced by said power supply to tend to maintain the current through said reference transistor constant and thereby to tend to maintain the currents through said switching transistors constant;

said current-setting means comprising a set of resistors each connected between a respective switching transistor and a voltage supply line;

said reference transistor being matched to one of said switching transistors; and an additional resistor connected between said reference transistor and said voltage supply line to match the resistor for said one switching transistor;

said sensing means being operable to adjust the voltage of said supply line to maintain the current through said reference transistor constant, and thereby tend to maintain the currents through the switching transistors constant.

30. In a digital-to-analog converter, the combination of:

a plurality of switching transistors activatable in a selected pattern corresponding to a digital input signal;

output circuit means coupled to said switching transistors to combine the currents contributed by any activated switching transistors;

means for setting the currents contributed individually by the switching transistors in accordance with a digital-to-analog weighting pattern;

a power supply for producing a supply voltage for said switching transistors;

a reference transistor energized by said power supply;

sensing means responsive to the current flow through said reference transistor, said sensing means including means operable to adjust the voltage produced by said power supply to tend to maintain the current through said reference transistor constant and thereby to tend to maintain the currents through said switching transistors constant;

said power supply means including a voltage source an a reference resistor connected thereto to establish a reference current;

said reference transistor being matched to one of said switching transistors;

said sensing means serving to compare said reference current with the output current of said reference transistor and operable to adjust the voltage supplied to all of said transistors so as to tend to maintain the reference current equal to said reference transistor output current.

31. Apparatus as claimed in claim 30, wherein said sensing means comprises an operational amplifier to sum said reference current with said output current.

32. Apparatus as claimed in claim 31, wherein said reference current is compared with the collector current of said reference transistor.

* * * * *

UNITED STATES PATENT OFFICE

CERTIFICATE OF CORRECTION

Patent No. 3,685,045 Dated August 15, 1972

Inventor(s) James J. Pastoriza

It is certified that error appears in the above-identified patent and that said Letters Patent are hereby corrected as shown below:

Column 1, line 65, "PNP" should read -- NPN -- .

Signed and sealed this 15th day of May 1973.

(SEAL)
Attest:

EDWARD M.FLETCHER,JR.
Attesting Officer

ROBERT GOTTSCHALK
Commissioner of Patents